United States Patent
Kuebler

(10) Patent No.: US 9,793,122 B2
(45) Date of Patent: Oct. 17, 2017

(54) COMBINED LASER PROCESSING SYSTEM AND FOCUSED ION BEAM SYSTEM

(71) Applicant: Carl Zeiss Microscopy GmbH, Jena (DE)

(72) Inventor: Carl Kuebler, Aalen (DE)

(73) Assignee: CARL ZEISS MICROSCOPY GMBH, Jena (DE)

( * ) Notice: Subject to any disclaimer, the term of this patent is extended or adjusted under 35 U.S.C. 154(b) by 799 days.

(21) Appl. No.: 13/905,085

(22) Filed: May 29, 2013

(65) Prior Publication Data

US 2013/0323937 A1    Dec. 5, 2013

(30) Foreign Application Priority Data

May 30, 2012    (DE) .......................... 10 2012 010 708

(51) Int. Cl.
*B23K 26/00*    (2014.01)
*H01L 21/268*    (2006.01)
(Continued)

(52) U.S. Cl.
CPC ........ *H01L 21/268* (2013.01); *B23K 26/0608* (2013.01); *B23K 26/0676* (2013.01);
(Continued)

(58) Field of Classification Search
CPC .............. H01L 21/268; B23K 26/0676; B23K 26/0608; B23K 26/36; B23K 26/1224;
(Continued)

(56) References Cited

U.S. PATENT DOCUMENTS

2002/0170675 A1    11/2002    Libby et al.
2005/0059265 A1*   3/2005    Im ...................... B23K 26/0604
                                                             438/795
(Continued)

FOREIGN PATENT DOCUMENTS

DE    60 2006 000 278 T2    11/2008
DE    10 2008 052 006 A1     4/2010
(Continued)

OTHER PUBLICATIONS

Dutch search report, for corresponding Dutch patent application No. 2010889, dated Mar. 17, 2015.
(Continued)

*Primary Examiner* — Mark Paschall
(74) *Attorney, Agent, or Firm* — Alston & Bird LLP

(57) ABSTRACT

A processing system for forming a cross-section of an object. The processing system comprises a focused ion beam system for forming the cross-section from a pre-prepared surface region of the object and a laser and a light optical system for forming the pre-prepared surface region by laser ablation of a processing region of the object with a first and a second laser beam. The light optical system is configured to direct the first and the second laser beams onto common impingement locations of a common scanning line in the processing region for scanning the first laser beam and for scanning the second laser beam. For each of the impingement locations, an angle between a first incidence direction along an axis of the first laser beam and a second incidence direction along an axis of the second laser beam is greater than 10 degrees, measured in a stationary coordinate system.

28 Claims, 6 Drawing Sheets

(51) Int. Cl.
| | |
|---|---|
| *B23K 26/067* | (2006.01) |
| *B23K 26/06* | (2014.01) |
| *B23K 26/36* | (2014.01) |
| *B23K 26/12* | (2014.01) |
| *B23K 26/082* | (2014.01) |
| *B23K 26/362* | (2014.01) |
| *B23K 26/40* | (2014.01) |
| *H01L 21/66* | (2006.01) |
| *B23K 103/00* | (2006.01) |

(52) U.S. Cl.
CPC ........ *B23K 26/082* (2015.10); *B23K 26/1224* (2015.10); *B23K 26/36* (2013.01); *B23K 26/362* (2013.01); *B23K 26/40* (2013.01); *B23K 2203/52* (2015.10); *H01J 2237/30433* (2013.01); *H01J 2237/31745* (2013.01); *H01L 22/12* (2013.01)

(58) Field of Classification Search
CPC .... B23K 26/082; B23K 26/362; B23K 26/40; B23K 2203/52; H01J 2237/30433; H01J 2237/31745
USPC ............. 219/121.68, 121.69, 121.76, 121.77
See application file for complete search history.

(56) References Cited

U.S. PATENT DOCUMENTS

| | | | |
|---|---|---|---|
| 2006/0186336 A1 | 8/2006 | Giannuzzi et al. | |
| 2008/0073573 A1* | 3/2008 | Takami | B23K 26/04 250/492.2 |
| 2010/0051828 A1 | 3/2010 | Doemer et al. | |
| 2010/0090108 A1 | 4/2010 | Hoeche | |
| 2011/0198326 A1 | 8/2011 | Doemer | |
| 2012/0091363 A1 | 4/2012 | Doemer et al. | |
| 2013/0057874 A1 | 3/2013 | Doemer et al. | |
| 2015/0158120 A1* | 6/2015 | Courvoisier | B23K 26/0613 264/482 |

FOREIGN PATENT DOCUMENTS

| | | |
|---|---|---|
| EP | 0 141 272 A1 | 5/1985 |
| EP | 2 359 977 A1 | 8/2011 |

OTHER PUBLICATIONS

Maaike M. V. Taklo, "Bonding and TSV in 3D IC Integration: Physical Analysis with a Plasma FIB", Microscopy and Analysis, 25(7), Nov. 2011, pp. 9-12.

Office action in German patent application No. 10 2012 010 708.0 dated Feb. 21, 2013 (with English translation).

* cited by examiner

COMBINED LASER PROCESSING SYSTEM AND FOCUSED ION BEAM SYSTEM

CROSS-REFERENCES TO RELATED APPLICATIONS

This application claims priority of Patent Application No. 10 2012 010 708.0, filed May 30, 2012 in Germany, the entire contents of which are incorporated by reference herein.

FIELD

The present disclosure relates to a system for forming cross-sections of an object by successively performing laser ablation and focused ion beam (FIB) preparation.

BACKGROUND

For investigating material structures, which are buried below the surface of the object, procedures have been developed for forming and inspecting cross-sections of the object. These procedures have gained considerable importance, since they allow to inspect structural properties of manufactured semiconductor structures.

The inspection of the exposed cross-section is typically performed by using a scanning electron microscope. In alternative procedures, a sample section is prepared to form a TEM lamella. The TEM lamella is separated from the remaining sample and inserted into a transmission electron microscope (TEM) for inspection.

Applying these procedures in the field of quality assurance and process control requires a sufficiently short processing time in order to inspect an economically efficient number of samples per time interval.

This requirement becomes even more relevant, when modern semiconductor structures are to be inspected, such as multiple stacked ICs and 3D MEMS. Analyzing such semiconductor structures usually requires exposing large cross-sectional areas, which are buried deeply below the surface.

Hence, there exists a need for a system and a method, which allow detailed inspections of sample cross-sections within a short time.

SUMMARY

Embodiments provide a processing system for forming a cross-section of an object. The processing system comprises a focused ion beam system for forming the cross-section from a pre-prepared surface region of the object. The processing system further comprises a laser and a light optical system for forming the pre-prepared surface region by laser ablation of a processing region of the object with a first and a second laser beam. The light optical system may be configured to direct each of the first and the second laser beams onto common impingement locations of a common scanning line in the processing region for scanning the first laser beam and for scanning the second laser beam. For each of the impingement locations, an angle between a first incidence direction along an axis of the first laser beam and a second incidence direction along an axis of the second laser beam may be greater than 10 degrees, measured in a stationary coordinate system. The processing system may further comprise a positioning system for positioning the object such that a translational movement translates the processing region from a first arrangement of the processing region for the scanning of the first laser beam to a second arrangement of the processing region for the scanning of the second laser beam.

It has shown that by irradiating the preparation region with the first and the second laser beams, a pre-prepared surface region can be obtained having a low surface roughness. Hence, the subsequent focused ion beam preparation of the cross-section from the pre-prepared surface region can be performed within a sufficiently short time.

This allows to use the processing system for performing routine inspections, as commonly applied in the field of quality assurance and process control.

The short preparation time further allows to form cross-sections having a large exposed area, which were previously buried deeply below the unprepared surface. This is in particular advantageous when modern semiconductor structures, such as 3D-MEMs and multiple stack ICs are inspected.

The laser may be a pulse laser. A pulse duration of the laser may be within a range of between $10^{-16}$ seconds and $10^{-8}$ seconds. The processing system may comprise two lasers. The first laser may be configured to generate the first laser beam and the second laser may be configured to generate the second laser beam.

The light optical system may be configured such that each of the first and second laser beams are focused at the processing region of the object. Each of the beam paths of the first and/or the second laser beam may extend between the laser and the preparation region. The light optical system may comprise an objective lens, which is traversed by the first and/or the second laser beam. Alternatively, the light optical system may comprise two objective lenses, wherein each of the objective lenses is traversed either by the first or the second laser beam such that each laser beam either traverses the first or the second objective lens. The objective lens may be an f-theta objective lens.

The light optical system may comprise a flat field optical system. The focal plane of the first laser beam and the focal plane of the second laser beam may be located in a common plane. The scanning field of the laser beam may be located in the focal plane of the laser beam. A scanning field of the first laser beam and a scanning field of the second laser beam may be located in a common plane. A beam waist diameter at the focus of the first and/or the second laser beam may be within a range of 1 micrometer and 5 millimeters.

Additionally or alternatively, the light optical system may have a variable focal length. The light optical system may be configured to be controllable, such that the focal length is variable in accordance with control signals received from a controller. By way of example, the light optical system comprises actuators, which are configured to displace an optical component depending on the received control signals.

The light optical system may be configured such that each of the first laser beam and the second laser beam can be scanned, in particular independently from each other, in the processing region. A diameter of a scanning field of the first and/or the second laser beam may be within a range of between 100 micrometers and 500 millimeters, or within a range of between 100 micrometers and 100 millimeters. Alternatively, the diameter of the scanning field may be within a range of between 100 micrometers and 80 millimeters, or within a range of between 100 micrometers and 50 millimeters, or within a range of between 100 micrometers and 10 millimeters. The positioning system may be configured to arrange the processing region in the scanning field of the first laser beam and/or in the scanning field of the second laser beam. The scanning fields of the first and second laser beams may be arranged such that they overlap each other or such that they are separated from each other. The positioning system may be configured such that the translational movement translates the processing region from the scanning field of the first laser beam into the scanning field of the second laser beam.

The light optical system may comprise a scanning unit for scanning the first laser beam and/or for scanning the second laser beam. The scanning unit may comprise one or more deflecting elements. The scanning unit may be in signal communication with a controller. The scanning unit may be configured such that a one-dimensional scan (X-scan or Y-scan) or a two-dimensional scan (XY-scan) can be performed with the first and/or the second laser beam. Alternatively or additionally, the positioning system may be configured to displace the object relative to the first and/or the second laser beams in order to perform the scan. Alternatively or additionally, the processing system comprises two scanning units, wherein each of the scanning units is configured to scan either the first or the second laser beam.

The pre-prepared surface region may be a peripheral region of the processing region. In other words, an unprepared surface region may be located adjacent to the pre-prepared surface region. The pre-prepared surface region may be a sidewall of an ablation groove or an ablation step, wherein the ablation groove or the ablation step has been formed by laser ablation.

The focused ion beam system may be configured to generate a focused ion beam for performing ion beam etching. The ion beam etching may include dry etching. The focused ion beam system may further comprise a gas supply system, which is configured to supply process gas to the processing region. The process gas may be activatable by the ion beam of the focused ion beam system, by the electron beam of the scanning electron microscope system and/or by the ion beam of the ion microscope system. The ion microscope system may comprise a gas field ion source. The ion microscope system may for example be a helium ion microscope system.

The activated process gas may cause material ablation in the processing region. The focused ion beam system may be configured such that the cross-section can be formed from the pre-prepared surface region by one or more processing steps. The cross-section may be a depth cross-section or a vertical cross-section. The cross-section may be oriented inclined or substantially vertically relative to the unprepared object surface. In each of the processing steps, the focus diameter of the focused ion beam may be substantially the same or may be different. The ion beam may be focusable onto the processing region. A diameter of the focus of the focused ion beam may be within a range of between 5 nanometers and 30 micrometers. In the last processing step, the focus diameter of the ion beam may be within a range of between 5 nanometers and 20 nanometers.

The focused ion beam system may comprise a liquid metal ion source (LMIS). The liquid metal ion source may be a gallium ion source. Alternatively, the focused ion beam system may comprise a plasma ion source. The plasma ion source may for example be a xenon ion source. Alternatively, the focused ion beam system may comprise a field ion source. The field ion source may for example be a helium, argon or xenon field ion source.

The processing system may comprise a scanning electron microscope system and/or an ion microscope system. The ion microscope system may comprise a gas field ion source. The ion microscope system may be a helium ion microscope system. The scanning electron microscope system and/or the ion microscope system may be configured to monitor the process of forming of the cross-section from the pre-prepared surface region. The monitoring may be performed by scanning the focused electron beam and/or the focused ion beam. An object region of the scanning electron microscope system and/or the ion microscope system may at least partially overlap with the object region of the focused ion beam system.

The axis of the laser beam may be a symmetry axis of the laser beam. In each of the arrangements A and B of the processing region, the common scanning line may be oriented along a plane, which is spanned by the axis of the first laser beam and the axis of the second laser beam. An angle between the scanning line and the plane may be less than 20 degrees or less than 10 degrees or less than 5 degrees or less than 1 degree.

The stationary coordinate system may be a coordinate system, which is stationary with respect to a vacuum chamber of the processing system.

The light optical system may be configured such that the first and the second laser beams are generated successively. Alternatively, the light optical system may be configured such that the first laser beam and the second laser beam are generated simultaneously. Laser beams, which are generated simultaneously may be directed to different processing regions. In some embodiments, which are described further below, the laser beams are simultaneously directable to a common processing region.

The scanning of the first laser beam and the scanning of the second laser beam may be performed by directing the first and the second laser beam onto common impingement locations of the common scanning line. In other words, the common impingement locations may be irradiated by the first and the second laser beams.

The processing system may be configured such that a translational movement translates the processing region from a first arrangement for the scanning of the first laser beam to a second arrangement for the scanning of the second laser beam. The arrangement of the processing region may be defined herein as the position and orientation of the processing region. Hence, both, the scanning of the first laser beam and the scanning of the second laser beam are performed with the processing region or the object being arranged in an identical or substantially identical orientation. The translational movement may be performed along a straight line. A direction of the translational movement may be oriented perpendicular to a direction of the optical axis of the objective lens of the light optical system.

According to an embodiment, the controller is in signal communication with the positioning system. The positioning system performs, in accordance with control signals received from the controller, the translational movement for translating the processing region from the first into the second arrangement.

According to a further embodiment, the light optical system is configured such that the angle between the first incidence direction and the second incidence direction is greater than 15 degrees, or greater than 20 degrees, or greater than 30 degrees, or greater than 40 degrees, or greater than 50 degrees, or greater than 70 degrees, measured relative to the stationary coordinate system. The angle may be less than 150 degrees.

The processing system may be configured such that the angle is variable. The light optical system may be configured to be controllable to allow the angle to be controlled by control signals of a controller. By way of example, the controller is configured to control an actuator of a deflecting element of the light optical system and/or configured to control an actuator of the positioning system.

The incidence direction may be defined as a direction along the axis of the laser beam measured in the focal region or in the scanning field of the laser beam. In other words, the incidence direction may be determined at the location of the object.

The positioning system may be configured such that the translational movement translates the processing region from the scanning field of the first laser beam into the scanning field of the second laser beam. The processing system may be configured such that before and after the translational movement, a position of the object and/or a position of the object holder is determinable. The accuracy of the position determination, at least in one direction, may be more accurate than 1 micrometer, or more accurate than 0.5 micrometers, or more accurate than 0.2 micrometers, or more accurate than 0.1 micrometers, or more accurate than 50 nanometers.

The processing system may comprise a position sensor for determining the position of the object and/or the position of the object holder.

The position sensor may comprise an interferometer. Additionally or alternatively, the position sensor may comprise one or more marks, such as fiducial marks, which are provided on the object and/or on the object holder such that they can be scanned by a laser beam, which is generated by the light optical system. The processing system may comprise one or more detectors, which are configured to detect an impingement of the laser beam onto the marks.

Additionally or alternatively, the position sensor may comprise a detection unit, which is configured to detect incident light of the laser beam at a light sensing location, which is stationary relative to the object and/or to the object holder.

The detection unit may be configured to detect light of the laser beam, which is incident onto the light sensing location. For example, the detection unit comprises a photosensor, which is arranged at the light sensing location. Additionally or alternatively, the detection unit may comprise a light guide, for guiding light from the light sensing location to a photo sensor, which is arranged at a distance from the light sensing location. Thereby, light of the lasers, which is incident on the light sensing location, is detectable by the remotely located photo sensor.

According to an embodiment, the processing system comprises a pivotable deflecting element. The light optical system may be configured to switch from the first incidence direction to the second incidence direction. The switching from the first incidence direction to the second incidence direction may comprise a pivoting of the pivotable deflecting element.

The pivotable deflecting element may be for example a pivotable mirror. The pivotable deflecting element may be configured such that the first incidence direction is continuously transformable into the second incidence direction. The pivotable deflecting element may be arranged in the beam path of the first laser beam and in the beam path of the second laser beam. The pivotable deflecting element may be a last deflecting element in the beam path of the first and/or second laser beam. In other words, the beam path between the last deflecting element and the processing region may be free from deflecting elements. The pivotable deflecting element may be arranged in the beam path of the first and second laser beams before or after the objective lens. The pivotable deflecting element may be arranged outside or within a vacuum chamber of the processing system.

The pivotable deflecting element may be configured as a single axis scanning system or configured as a 2-axis scanning system for scanning the first and/or the second laser beam. In other words, the pivotable deflecting element may be configured such that by pivoting the pivotable deflecting element about one or two pivoting axes, the first and/or the second laser beam is scannable in one or two dimensions.

Alternatively, the light optical system may comprise a scanning system in addition to the pivotable deflecting element, wherein the scanning system is configured such that the first and/or second laser beam is scannable in one or two dimensions.

Embodiments provide a processing system for forming a cross-section of an object, the processing system comprises a focused ion beam system for forming the cross-section from a pre-prepared surface region of the object. The processing system may further comprise a laser and a light optical system for forming the pre-prepared surface region by laser ablation of a processing region of the object with a first and a second laser beam. Each of the first and the second laser beams ($35a$, $36a$) may be directable onto common impingement locations of a common scanning line in the processing region for scanning the first laser beam and for scanning the second laser beam. An arrangement of the processing region during the scanning of the first laser beam may be identical or substantially identical to an arrangement of the processing region during the scanning of the second laser beam. In other words, the first and the second laser beams may be scanned at a constant or substantially constant position and orientation of the processing region. The arrangement of the processing region may be stationary relative to the stationary coordinate system. For each of the impingement locations, an angle between a first incidence direction along an axis of the first laser beam and a second incidence direction along an axis of the second laser beam may be greater than 10 degrees, measured in a stationary coordinate system.

Thereby, it is possible to form the pre-prepared surface region with laser beams having the first and the second incidence direction without moving the object. This allows to achieve a particularly short processing time for forming the cross-section from the pre-prepared surface region.

The processing system may be configured such that the first and the second laser beams are generated simultaneously. This allows to simultaneously process a common processing region by both laser beams.

Additionally or alternatively, the processing system may be configured such that the processing region can be successively processed by the first and the second laser beams. The scanning field of the first laser beam and the scanning field of the second laser beam may at least partially overlap each other. The common scanning line may be oriented along a plane, which is spanned by the axis of the first laser beam and the axis of the second laser beam.

The processing system may be configured such that the axis of the first laser beam and the axis of the second laser beam intersect in an object region of the light optical system. The object region may be spatial region, in which the object is arranged for performing the laser ablation.

An incidence direction of the first laser beam and/or an incidence direction of the second laser beam measured at a location of the objective lens may be oriented substantially parallel relative to an optical axis of the objective lens. An impingement location of the first laser beam on the objective lens may be different from an impingement location of the second laser beam on the objective lens.

The first laser beam and/or the second laser beam may impinge on the objective lens as collimated beams. For the scanning of the first and the second laser beam, the processing region may be arranged in a focal plane or at a focal point of the objective lens.

According to an embodiment, the light optical system comprises a first and a second deflecting element, each of which deflecting either the first or the second laser beam. A deflection point of the first laser beam may be different from a deflection point of the second laser beam.

By way of example, the first and/or the second deflecting element may comprise a mirror and/or a beam splitter. The deflection point of the first laser beam may be located at the first deflecting element or may be formed by the first deflecting element. The deflection point of the second laser beam may be located at a second deflecting element or may be formed by the second deflecting element.

The first deflecting element may be the only deflecting element of the beam path of the first laser beam. Alternatively, the first deflecting element may be the last deflecting element of a plurality of deflecting elements, which are arranged in the first beam path. In other words, the beam path of the first laser beam between the first deflecting element and the processing region may be free from deflecting elements. The same may apply to the second deflecting element being arranged in the second beam path. As defined herein, deflecting elements do not include lenses or lens systems, such that the objective lens.

The angle, which is formed between the first and the second incidence direction may depend on the first and the second deflection points. The objective lens may be arranged in the beam path of the first and/or in the beam path of the second laser beam before or after the first and/or second deflecting element.

The first and/or the second deflecting element may be configured as scanning systems for scanning the first and/or the second laser beam in one or two dimensions.

According to an embodiment, the first deflecting element is configured as a beam splitter.

The beam splitter may comprise a semi-transparent mirror. The beam splitter may be a deflecting element for the first laser beam. The second laser beam may traverse the beam splitter without being deflected. After having traversed the beam splitter, the second laser beam may impinge onto the second deflecting element, which deflects the second laser beam.

According to a further embodiment, the processing system comprises a controller, which in signal communication with the light optical system. The controller and the light optical system may be configured such that the light optical system switches between the scanning of the first laser beam and the scanning of the second laser beam in accordance with control signals received from the controller.

The light optical system may comprise one or more actuators for switching between the scan of the first laser beam and the scan of the second laser beam. The actuator may be in signal communication with the controller. The actuator may engage with a pivotable deflecting element. The pivotable deflecting element may be configured to change from the first incidence direction to the second incidence direction by performing a pivoting movement.

Alternatively, the pivotable deflecting element may be a switching mirror, which selectively directs light of the laser onto a first or a second deflecting element. Each of the first and the second deflecting elements may deflect either the first or the second laser beam, such that the first and the second deflecting elements deflect different laser beams. Thereby, the deflection point of the first laser beam is different to a deflection point of the second laser beam.

According to an embodiment, the light optical system is configured such that a lateral deviation between a scanning path of the first laser beam and a scanning path of the second laser beam, generated by the scanning of the first and second laser beams, is smaller than 1 micrometer, or smaller than 0.5 micrometers, or smaller than 0.2 micrometers, or smaller than 0.1 micrometers, or smaller than 50 nanometers.

This allows to form the pre-prepared surface region along the common scanning line such that the pre-prepared surface region has a low surface roughness. Thereby, it is possible to shorten the preparation time required for the focused ion beam preparation. The common scanning line may be oriented along a plane, which is spanned by the axis of the first laser beam and the axis of a second laser beam.

The lateral deviation between the scanning paths may be a maximum lateral deviation of all locations on the scanning paths. A desired upper limit for the lateral deviation may be achieved by assuring a sufficient positioning accuracy of the object at least in a direction transverse to the scanning path. Alternatively or additionally, a desired upper limit for the lateral deviation may be achieved by assuring a sufficient adjustment accuracy and/or pivoting accuracy of components of the light optical system.

A scanning path may be defined as a path in the scanning field, which is scanned by the laser beam, i.e. the locations onto which the laser beam actually impinges. Thereby, the scanning path may deviate from the common scanning line, onto which the laser beam is directed. A lateral deviation between the scanning paths of the laser beams may be defined as a distance between the scanning paths measured in a direction transverse to one of the scanning paths.

According to an embodiment, the processing system comprises a controller, which is in signal communication with the light optical system, wherein the controller is configured to control the light optical system such that the first laser beam forms a scan path. The controller is further configured to determine the course of the formed scan path. Depending on the determined course, the controller controls the light optical system to aim the second laser beam onto the scan path of the first laser beam.

The controller may be configured such that the course of the scan path is determined depending on signals, which are transmitted to the light optical system for performing the scanning of the first laser beam, depending on signals, which are transmitted to the positioning system and/or depending on a position measurement of the object holder position. The course of the scan path may comprise the sum of all impingement locations. The course of the scan path may be determined relative to the object, relative to the object holder and/or relative to the stationary coordinate system.

According to a further embodiment, the light optical system is configured such that the axis of the first laser beam and the axis of the second laser beam are aligned along a common beam guidance plane, during the scanning of the first and the second laser beams.

The beam guidance plane may be determined relative to the stationary coordinate system.

The expression "laser beam aligned with the beam guidance plane" may be defined to mean that the axis of the laser beam at the object or in the scanning field has an inclination relative to the beam guidance plane being less than 10 degrees, or less than 5 degrees, or less than 1 degree, or less than 0.1 degrees.

According to a further embodiment, the processing system is configured such that a scanning accuracy for the scanning of the first laser beam is more accurate than 1 micrometer, or more accurate than 0.5 micrometers, or more accurate than 0.2 micrometers, or more accurate than 0.1 micrometers, or more accurate than 50 nanometers. The same accuracy may apply for the scanning of the second laser beam.

The scanning accuracy may be defined as the accuracy for aiming the laser beam onto the common scanning line. Thereby, the scanning accuracy may be a measure for a maximum distance between and an intended impingement location and the actual impingement location of the laser beam. A more accurate scanning accuracy results in a smaller distance.

According to a further embodiment, the lateral deviation between the scan path of the first laser beam and the scan path of the second laser beam is less than one half or less than one fifth or less than one tenth or less than one hundredth of the scanning accuracy of the first or second laser beam. Thereby, the light optical system may be configured such that the scanning accuracy is more accurate in the direction transverse to the scan path than in the direction along the scan path. Thereby, the processing system may be optimized for high precision preparation of the pre-prepared surface region in a direction transverse to the scan path. This also allows fast positioning of the object and fast scanning of the laser beams, since it is not necessary to provide a high scanning accuracy for all directions.

According to a further embodiment, the processing system is configured such that an inclination of the beam guidance plane is adjustable over an angular range of at least 10 degrees, measured in a stationary coordinate system.

In other words, the inclination of the beam guidance plane can be varied by 10 degrees and by a plurality of values in between. The beam guidance plane may be continually adjustable over the angular range of at least 10 degrees. Thereby, a processing system is obtained, which allows to finely adjust the inclination of the pre-prepared surface region relative to an intended inclination of the cross section.

This also allows to adjust the inclination of the pre-prepared surface region formed by laser ablation such that the subsequent preparation step performed by the focussed ion beam system can be completed within a short period of time. The inclination may be measured relative to the stationary coordinate system, relative to the optical axis of the objective lens or relative to the object.

According to a further embodiment, the adjusting of the inclination over the angular range of at least 10 degrees comprises moving the object, and/or varying an incidence direction of the laser beam measured in the stationary coordinate system. The movement may be a translational movement, i.e. without changing an orientation of the object. The object may be moved along a movement direction, which may be oriented perpendicular to the translational movement for translating the processing region from the first arrangement into the second arrangement. The movement direction may be non-parallel to the beam guidance plane, which inclination is to be adjusted.

Thereby, it is possible to perform the adjustment of the beam guidance plane over the angular range of at least 10 degrees without varying the orientation of the object.

The processing system may be configured such that all object positions for the scanning of the first laser beam, for the scanning of the second laser beam and for the adjusting of the inclination of the beam guidance plane are located in a common positioning plane. This allows the positioning system to be configured as a planar positioning system. The positioning plane of the planar positioning system may be oriented perpendicular or substantially perpendicular to an optical axis of the objective lens of the light optical system.

According to a further embodiment, the processing system is configured such that the inclination of the beam guidance plane, measured in a stationary coordinate system, is adjustable over an angular range of at least 15 degrees, or at least 20 degrees, or at least 30 degrees, or at least 40 degrees, or at least 50 degrees. The adjustable angular range may be less than 120 degrees.

According to a further embodiment, the processing system comprises a controller, which is in signal communication with the light optical system and/or in signal communication with the positioning system. The inclination of the beam guidance plane may be adjustable by control signals of the controller, which are transmitted to the light optical system and/or the positioning system.

The light optical system and/or the positioning system may comprise one or more actuators for adjusting the inclination of the beam guidance plane over the angular range. The actuator may be in signal communication with the controller. The actuators may be engaged with one or more pivotable reflecting elements of the light optical system.

Each of the adjustable inclinations within the angular range may have a common or substantially common inclination direction. The inclination direction may be defined by a direction of the gradient vector of the beam guidance plane.

According to a further embodiment, the processing system is further configured to determine a target inclination of the cross-section. The processing system may be further configured to adjust the inclination of the beam guidance plane. The inclination of the beam guidance plane may be adjusted such that an inclination of the pre-prepared surface region is lower than the target inclination of the cross-section by a predetermined value. The predetermined value may be within the range of between 3 degrees and 10 degrees.

Thereby, it is possible, to form the pre-prepared surface region such that the required time for forming the cross-section is further reduced. According to a further embodiment, the processing system may be configured such that the inclination of the pre-prepared surface region is less than the target inclination of the cross-section by a value of between 3° and 8°, or by a value of between 3° and 5°.

The cross-section and the pre-prepared surface region may comprise a common or substantially common inclination direction.

The target inclination of the cross-section and the inclination of the pre-prepared surface region may be measured relative to the object, in particular relative to a surface of the object. The surface of the object may be an unprepared surface of the object. The surface may represent a plane, which is oriented perpendicular to a depth direction (z-direction) of the object, or may represent an average of a surface region over a diameter, which is thousand times greater or ten thousand times greater than the focal diameter of the laser beam. A small inclination may correspond to a small inclination angle relative to the surface of the object.

A normal vector of the pre-prepared surface region may form an angle with a normal vector of the surface, which is less than 90°. The normal vector may be directed in a direction away from the object.

By way of example, the target inclination may be determined such that the cross-section is oriented along an axis of a through silicon via, which extends in a direction normal to the surface. The target inclination of the cross-section may be determined depending on an orientation of the object relative to the positioning system and/or depending on microscopic images of the object. The microscopic images may be acquired for example by the scanning electron microscope system, by the focused ion beam system, by the gas field ion microscope system and/or by the light microscopy system.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
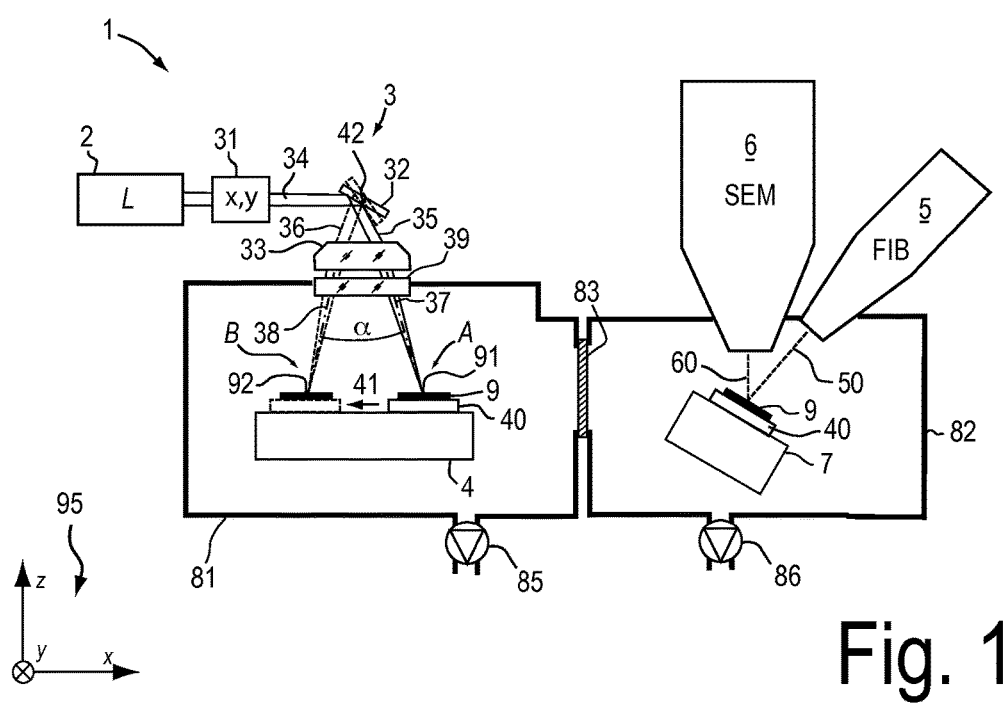
FIG. 1 schematically illustrates a processing system according to a first exemplary embodiment.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 schematically shows a processing system 1 according to a first exemplary embodiment. The processing system 1 comprises a laser 2, a light optical system 3 and a focused ion beam system 5, which are configured to process a processing region of the object by laser ablation and by focused ion beam processes.

By performing laser ablation of the object surface, a pre-prepared surface region is formed. From the pre-prepared surface region, a cross-section can be exposed using the focused ion beam 50.

The processing system 1 further comprises a scanning electron microscope system 6, which is arranged such that the process of forming the cross-section from the pre-prepared surface region can be monitored by scanning a focused electron beam over a portion of the processing region. Alternatively or additionally, it is conceivable that the processing system comprises an ion microscope system, which is configured such that forming the cross-section from the pre-prepared surface region can be monitored by scanning a focused ion beam.

The processing system 1 comprises a first vacuum chamber 81 and a second vacuum chamber 82, each of which being connected to a vacuum pump system 85, 86. The first and second vacuum chambers 81, 82 are connected to each other through a conduit, which comprises a gate valve 83.

When the gate valve 83 is in an open state, an object 9 and an object holder 40, to which the object 9 is attached, can be transferred between the first vacuum chamber 81 and the second vacuum chamber 82. In each of the vacuum chambers 81, 82, a positioning system 4, 7 is provided. The object holder 40 is configured such that it can be attached to each of the positioning systems 4, 7.

It is also conceivable, that the processing system 1 is configured such that the process of forming the pre-prepared surface region by laser ablation as well as the process of forming the cross-section by the focused ion beam 50 are performed in a common vacuum chamber.

The cross-section, which has been exposed by using the focused ion beam 50 may be inspected by the scanning electron microscope system 6. Alternatively or additionally, it is conceivable, that by laser ablation and by a subsequent process performed by the focused ion beam 50, a TEM-lamella is formed, which is separated from the remaining object 9 and inserted into a transmission electron microscope (TEM) for inspection.

The light optical system 3 is configured such that a first laser beam 35 and a second laser beam 36 can be generated. Each of the first and second laser beams 35, 36 traverse an objective lens 33 of the light optical system 3 and enter an interior of the first vacuum chamber 81 through a chamber window 39.

The light optical system 3 comprises a pivotable mirror 32 upon which laser light 34 of the laser 2 is incident. The pivotable mirror 32 is configured such that in a first pivoting position, the first laser beam 35 is generated and in a second pivoting position, the second laser beam 36 is generated. The pivoting mirror is pivotable about an axis 42. In FIG. 1, both, the second pivoting position of the pivoting mirror 32 and the second laser beam are shown in dashed lines, whereas the first pivoting position of the pivoting mirror and the first laser beam are shown in solid lines.

The light optical system 3 comprises a scanning system 31, which is configured to scan the first and the second laser beams 35, 36 in two dimensions within a scanning field 91, 92 of the respective laser beam.

A diameter of the scanning field 91, 92 of the first and/or second laser beam 35, 36 has a value within a range of between 100 micrometers and 500 millimeters. The light optical system 3 is configured such that the first and the second laser beams 35, 36 are scannable in the respective scanning field 91, 92 with an accuracy, which is more accurate than 1 micrometer, or more accurate than 0.5 micrometers, or more accurate than 0.1 micrometers, or more accurate than 50 nanometers.

Each of the first and the second laser beams 35, 36 are incident onto the objective lens 33 as collimated laser beams and/or as parallel (i.e. having a substantially planar wavefront) laser beams. The objective lens 33 has a focal length within a range of between 130 millimeters and 170 millimeters. A first incidence direction along an axis 37 of the first laser beam 35 and a second incidence direction along an axis 38 of the second laser beam 36 form an angle α in the processing region, which is greater than 10 degrees, measured relative to a stationary coordinate system 95.

The positioning system 4 is configured such that the processing region of the object 9 is arrangeable in the scanning field 91 of the first laser beam 35 and in the scanning field 92 of the second laser beam 36.

This allows to process the processing region of the object 9 by using two different incidence directions of the laser light, being different by at least 10 degrees, measured relative to the stationary coordinate system 95. Thereby, it is possible to form surface regions having a low surface roughness. This allows to perform the subsequent focused ion beam preparation within a short time.

The positioning system 4 is configured to transfer the processing region between the scanning field 91 of the first laser beam 35 and the scanning field 92 of the second laser beam 36. The transfer is performed by a translational movement 41. Through the translational movement 41, the object 9 is translated from a first arrangement A for processing the processing region with the first laser beam 35 to a second arrangement B for processing the processing region with the second laser beam 36.

In other words, the positioning system 4 does not perform a rotational movement during the translation from the arrangement A to the arrangement B. Thereby, it is possible to transfer the processing region fast and with high precision in order to assure that the first laser beam 35 and the second laser beam 36 can be directed onto common impingement locations in the processing region with a sufficiently high accuracy.

The positioning system 4 is configured such that a positioning accuracy for positioning the object in the arrangement A and/or B is, at least in a direction perpendicular to the translation direction 41, more accurate than 0.5 micrometers, or more accurate than 0.2 micrometers, or more accurate than 0.1 micrometers, or more accurate than 50 nanometers. The positioning accuracy may be defined as a difference between the intended position and the actual position.

To this end, the positioning system 4 comprises position sensors (not shown in FIG. 1) for determining position parameters of a position of the object holder 40. Alternatively or additionally, the light optical system 3 is configured such that the laser beam can be directed onto marks and/or light sensing locations, which are provided on the object 9 and/or object holder 40. The light sensing locations form part of detection units (not shown in FIG. 1), which are configured to detect light, which is incident onto the light sensing locations.

Figure 2A:
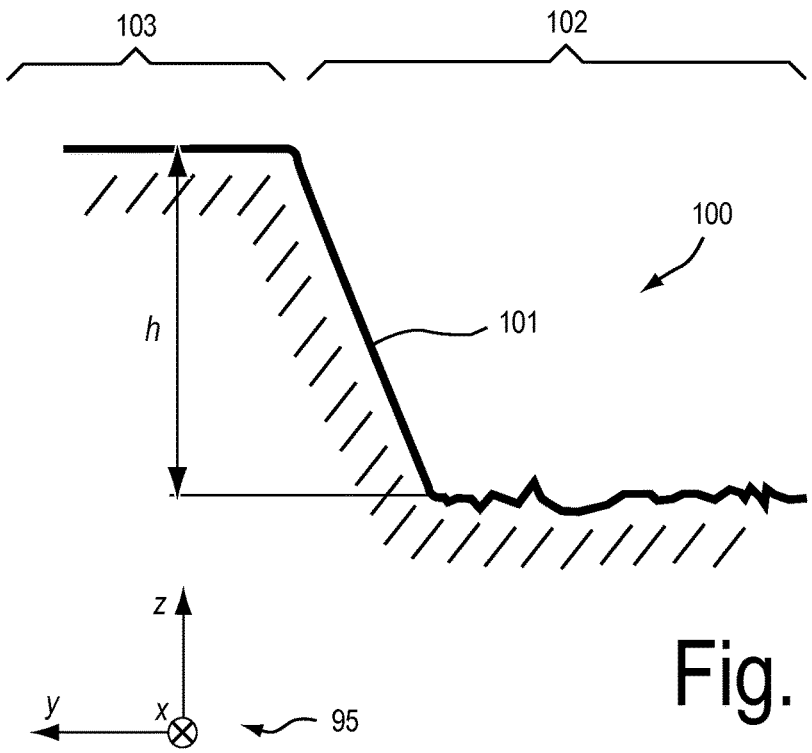
FIG. 2A schematically illustrates the generation of the pre-prepared surface region by the processing system of the first exemplary embodiment.
Figure 2B:
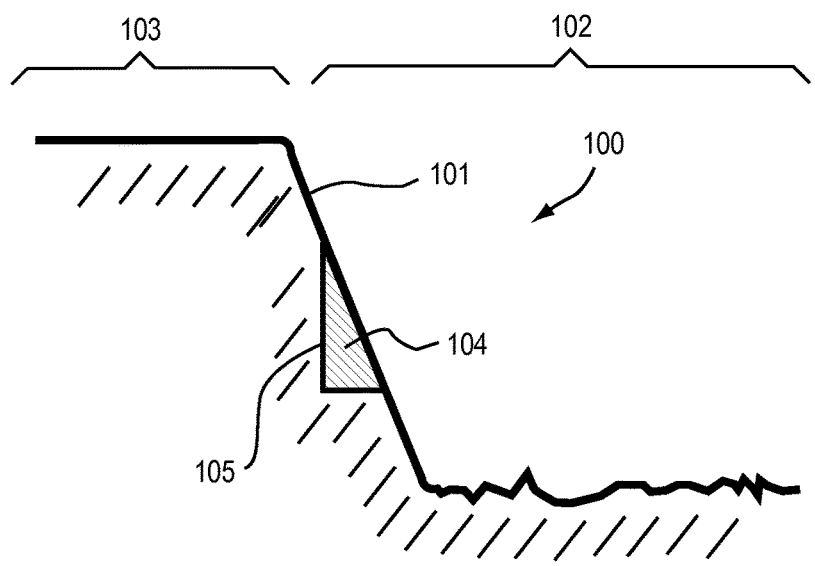
FIG. 2B schematically illustrates the generation of the cross-section from the pre-prepared surface region by the processing system of the first exemplary embodiment.

FIGS. 2A and 2B illustrate a first exemplary method for forming a cross-section of the object. FIG. 2A shows a cross-sectional view through a surface 100 of an object. In a first region 102, material has been removed by laser ablation with the first and the second laser beam. A second region 103 has not been irradiated by any of the laser beams, such that this region is left in its original state. Through laser ablation with the first and/or second laser beam, a step or a groove having a depth h is formed. By way of example, the depth h has a value within a range of between 5 micrometers and 100 micrometers, or between 5 micrometers and 1 millimeter.

In a transition area, the laser ablation has formed a pre-prepared surface region 101. By performing ion beam etching with the focused ion beam 50 (shown in FIG. 1) of the focused ion beam system, a cross-section can be formed from the pre-prepared surface region 101. This is shown in FIG. 2B. Through the processing of the pre-prepared surface region 101 with the focused ion beam, a volume portion 104 has been removed from the pre-prepared surface region 101 such that a cross-section 105 has been formed.

The pre-prepared surface region 101 is inclined relative to the sample surface as it is in its original state. The pre-prepared surface region 101 may be oriented relative to the intended cross section 105 such that the pre-prepared surface region 101 intersects or is in contact with the intended cross section 105.

Simultaneously to the irradiation of the pre-prepared surface region 101 with the focussed ion beam, a process gas may be supplied to the pre-prepared surface region 101 through a gas supply system (not shown in FIG. 1).

The removal of the volume portion 104 can be performed within a short time, when the surface roughness of the pre-prepared surface region 101 is sufficiently low. It has shown that this can be achieved by performing the laser ablation process with the first and the second laser beam.

The coordinate system 95, which is shown in FIG. 2A corresponds to the coordinate system 95, which is shown in FIG. 1. Thereby, a plane, which is spanned by the incidence direction along the axis 37 of the first laser beam 35 and the incidence direction along the axis 38 of the second laser beam 36 is oriented perpendicular to the drawing plane of FIGS. 2A and 2B.

Figure 3A:
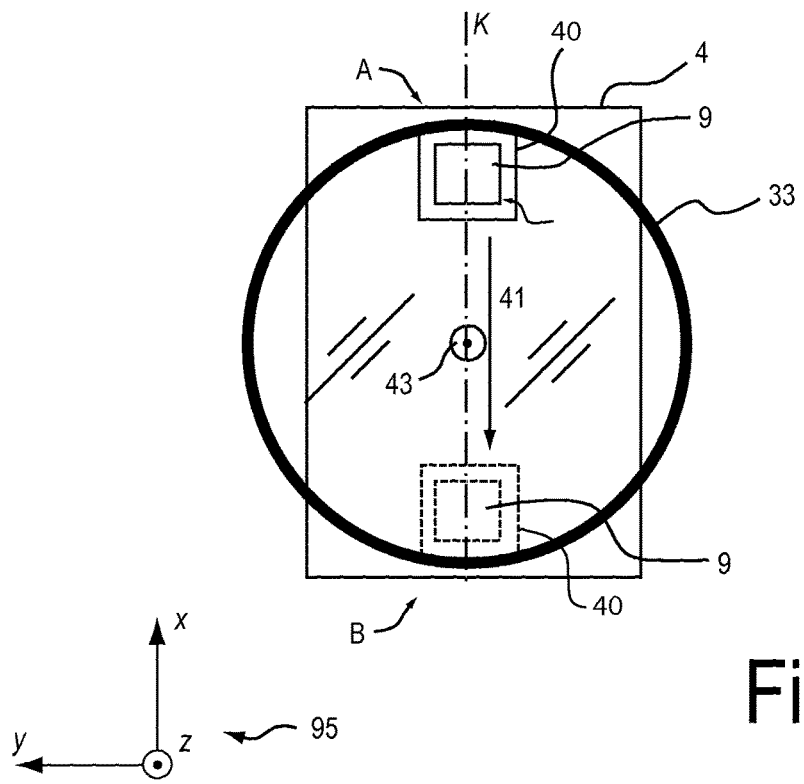
FIG. 3A schematically illustrates object positions during a first exemplary laser ablation process conducted with the processing system of the first exemplary embodiment.
Figure 3B:
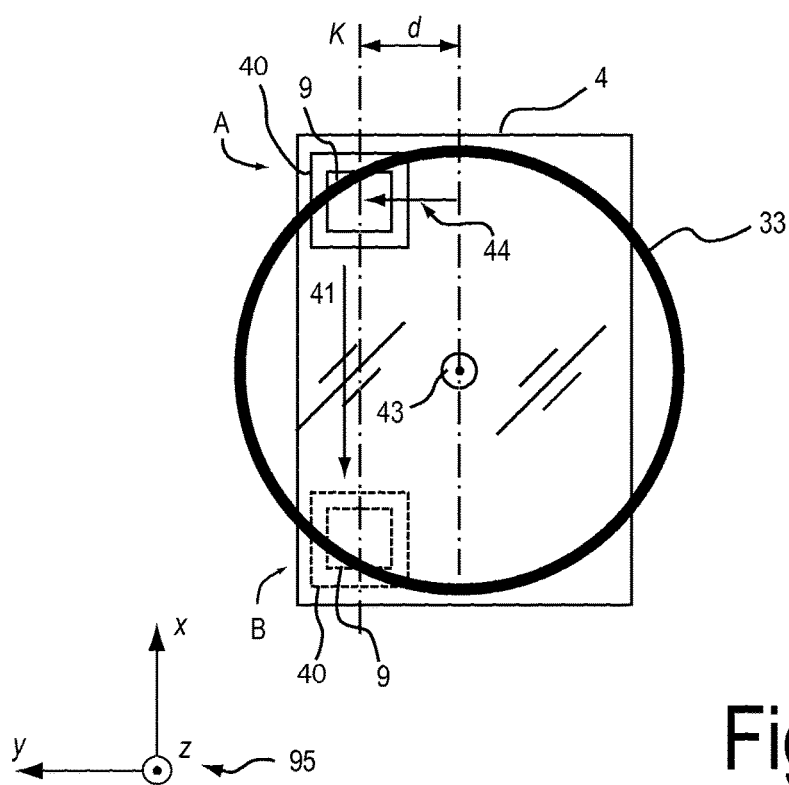
FIG. 3B schematically illustrates object positions during a second exemplary laser ablation process conducted with the processing system of the first exemplary embodiment.

FIGS. 3A and 3B illustrate exemplary laser ablation processes, as they can be performed by the processing system 1, which is shown in FIG. 1. FIGS. 3A and 3B are top views of the object 9, the object holder 40 and the positioning system 9, looking through the objective lens 33 of the processing system. The optical axis 43 of the objective lens 33 is therefore oriented perpendicular to the drawing plane of FIGS. 3A and 3B. For simplicity of illustration, the remaining components of the processing system are not illustrated in FIGS. 3A and 3B. The coordinate system 39, which is shown in FIGS. 3A and 3B corresponds to the coordinate system 95, which is shown in FIGS. 1 and 2A.

FIG. 3A illustrates the arrangement A of the processing region, in which the processing region is processed with the first laser beam. FIG. 3A also illustrates the arrangement B of the processing region, in which the processing region is processed with the second laser beam. Each of the laser beams is scannable such that a pre-prepared surface 101 (shown in FIGS. 2A and 2B) can be formed along the line K. To this effect, each of the first and second laser beams are scanned along a common scanning line in the processing region. In each of the arrangements A and B, the scanning line is oriented along the line K. The line K is oriented perpendicular to the optical axis 43.

The positioning system 4 is configured such that by a translational movement (illustrated by arrow 41), the object holder 40 and the object 9 are moved such that the processing region is transferred from arrangement A to arrangement B. A surface roughness of the pre-prepared surface region, which is formed by the laser ablation process in the arrangement A, is eliminated by the laser ablation process performed in the arrangement B. Thereby, a pre-prepared surface region can be formed, which has a low surface roughness. It is conceivable, that the processing region either in the arrangement A or in the arrangement B is located at the optical axis 43.

FIG. 3B illustrates an exemplary laser ablation process, which may be performed additionally or alternatively to the exemplary laser ablation process, which is shown in FIG. 3A. In the laser ablation process, which is shown in FIG. 3B, each of the arrangements A and B of the processing region are displaced along the Y-axis relative to the optical axis 43 of the objective lens 33. The object 9 is processed by the first an the second laser beam such that the pre-prepared surface region 101 (shown in FIGS. 2A and 2B) is formed along the line K, which is radially displaced a distance d from to the optical axis 43. Thereby, the line K and the optical axis 43 are skew, i.e. they do not intersect and are not parallel. A direction of the line K is oriented perpendicular to a direction of the optical axis 43. Each of the first and the second laser beams is scanned along a scanning line, which is oriented along the line K in each of the arrangements A and B.

In each of the processes, shown in FIGS. 3A and 3B, a beam guidance plane is spanned by the inclination directions along the axes of the first and second laser beams. The inclination of the beam guidance plane in the process of FIG. 3A is different from the inclination of the beam guidance plane in the process of FIG. 3B.

The variation of the inclination of the beam guidance plane is performed by a translation of the object 9 in a direction along the Y-axis and a corresponding deflection of the first and the second laser beams. Thereby the laser ablation process, which is shown in FIG. 3A and the laser ablation process, which is shown in FIG. 3B are performed at an identical orientation of the object 9.

It has shown that through the variation of the inclination of the beam guidance plane, an inclination of the pre-prepared surface region 101 (shown in FIGS. 2A and 2B) is variable. Thereby, it is possible to adjust the inclination of the pre-prepared surface region such that the focused ion beam preparation of the cross-section can be performed within a short time. This is further described in detail with reference to FIGS. 5A and 5A.

Figure 4A:
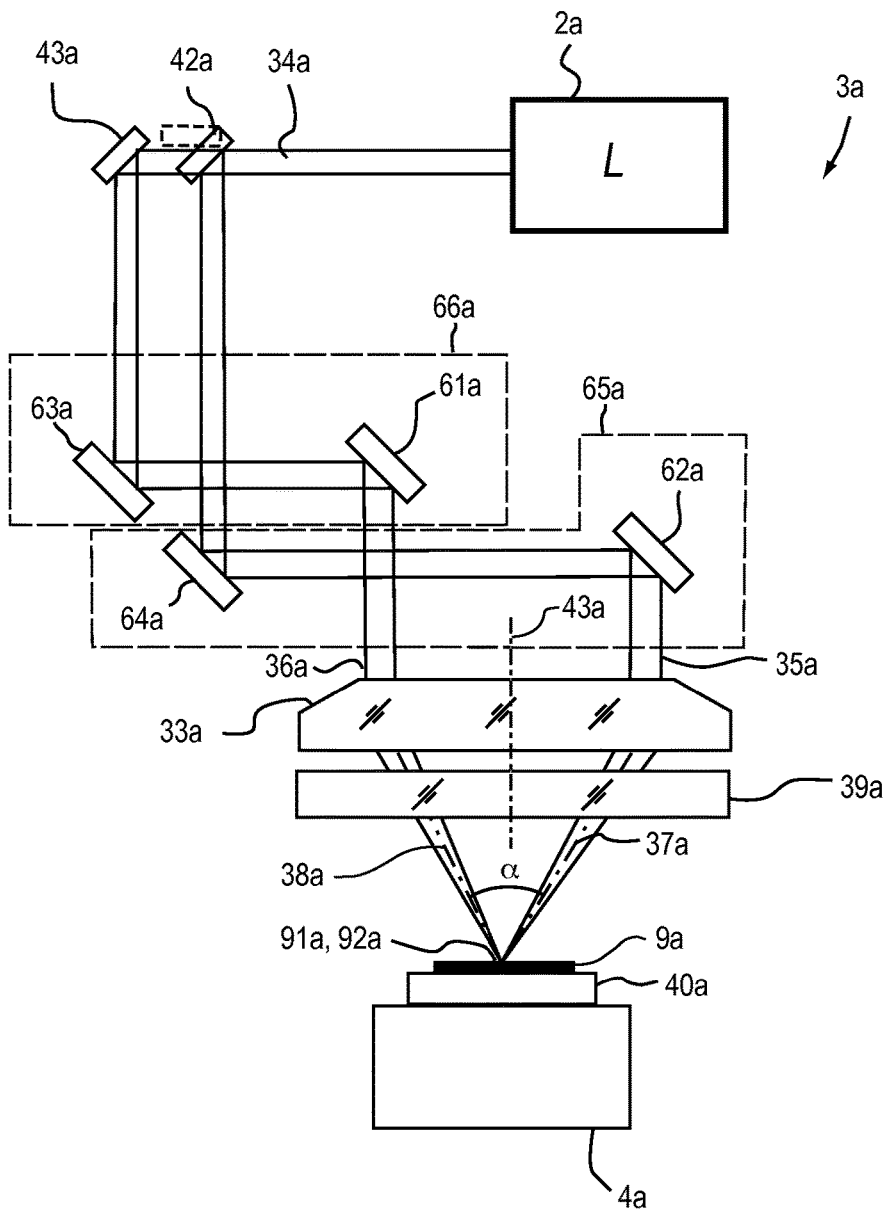
FIG. 4A schematically illustrates the arrangement of the laser and the light optical system in a processing system according to a second exemplary embodiment.

FIG. 4A shows a laser 2a and a light optical system 3a of a processing system according to a second exemplary embodiment. Components, which correspond to components of the first exemplary embodiments, shown in FIG. 1 with regard to their composition, their structure and/or function are generally designated with the same reference numerals, which however have a letter added to show differentiation.

The light optical system 3a comprises a pivotable switching mirror 42a. In a first position of the switching mirror 42a (illustrated by solid lines), the light optical system 3a generates the first laser beam 35a, whereas in a second position of the switching mirror 42a (illustrated by dashed lines), the light optical system 3a generates the second laser beam 36a.

In the first position of switching mirror 42a, light 34a of laser 2a is directed to a first scanning system 65a, which is configured such that the first laser beam 35a is scannable in the scanning field 91a of the first laser beam 35a in two dimensions. In the second position of the switching mirror 42a, the light 35a of the laser 2a is directed to a second scanning system 66a, which is configured such that the second laser beam 36a is scannable in the scanning field 92a of the second laser beam 36a in two dimensions. Each of the first and the second scanning systems 65a, 66a comprises two scanning mirrors 61a, 62a, 63a, 64a, each of which being pivotable about a pivoting axis of the respective scanning mirror. The pivoting axes of the two scanning mirrors of each scanning system are oriented orthogonally relative to each other such that the first and the second laser beams 35a, 36a can perform scanning movements in two dimensions in the scanning field 91a, 92a.

Additionally or alternatively, a scanning of the first and/or second laser beams 35a, 36a in one or two dimensions may be at least partially performed by movements of the positioning system. In such a scanning process, the first and/or second laser beams 35a, 36a may remain stationary during the scanning process.

The light optical system 3a of the second exemplary embodiment is configured such that the first and the second laser beams 35a, 36a can be directed to common impingement locations of the processing region without having to move the object 9a. The first and second laser beams 35a, 36a are directed by scanning mirrors 61a and 62a to the objective lens 33a and the object 9a from different deflection points.

The first and the second laser beams 35a, 36a may be incident onto the objective lens 33a along a direction, which is oriented parallel to an optical axis 43a of the objective lens 36a. When impinging on the objective lens 36a, the first and/or second laser beam 35a, 36a may be a collimated and/or a parallel laser beam (i.e. having planar wavefronts). The object 9a may be located in a focal plane of the objective lens 33a. Thereby, the first and the second laser beams 35a, 36a can be directed simultaneously onto common impingement locations without being required to change the position or orientation of the object 9a.

Thereby, it is possible to switch from a laser ablation process conducted with the first laser beam to a laser ablation process conducted with the second laser beam without being required to move the object 9a by using the positioning system 4a. Hence, a higher accuracy can be obtained for directing the first and second laser beams 35a, 36a onto common impingement locations in the processing region. It is also conceivable that a semi-transparent mirror is used in place of the switching mirror 42a. The semi-transparent mirror may be configured to simultaneously direct light 34a of the laser into both the beam path of the first laser beam 35a and the beam path of the second laser beam 36a. Thereby, it is possible to simultaneously perform laser ablation with the first and second laser beams 35a, 36a.

Figure 4B:
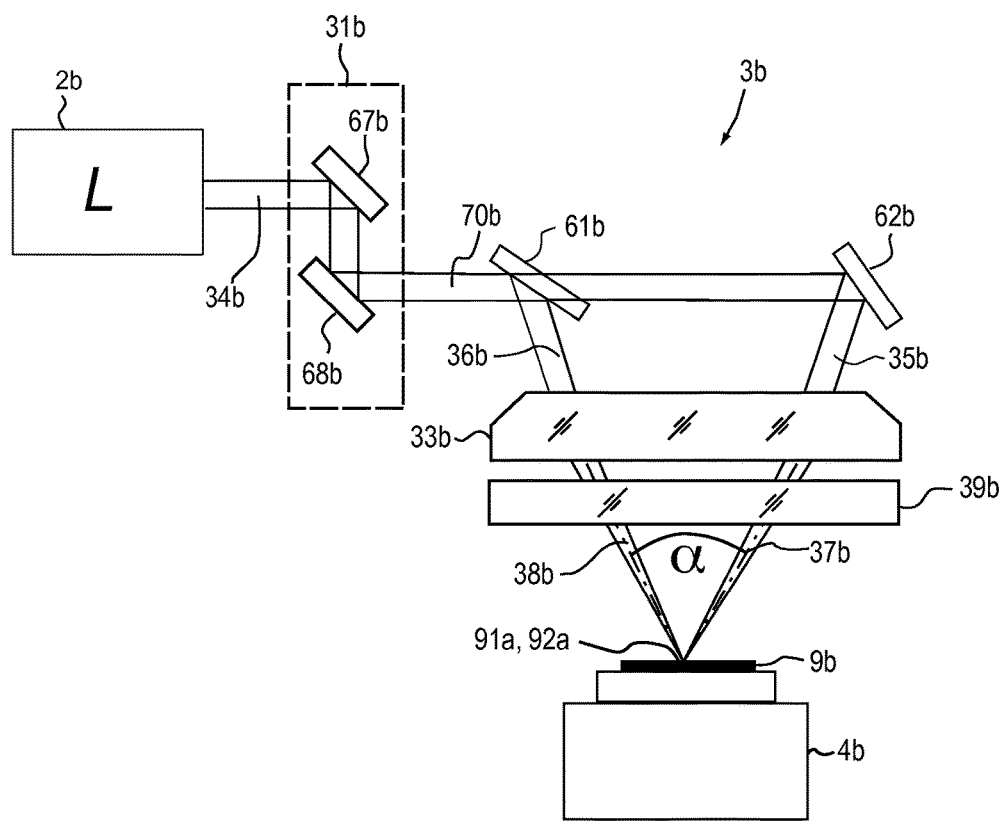
FIG. 4B schematically illustrates the arrangement of the laser and the light optical system in a processing system according to a third exemplary embodiment.

FIG. 4B shows a laser 2b and a light optical system 3b of a processing system according to a third exemplary embodiment. Components, which correspond to components of the first and second exemplary embodiments, which are shown in FIGS. 1 and 4A with regard to their composition, their structure and/or function are generally designated with the same reference numerals, which however have a letter added to show differentiation.

The light optical system 3b comprises a scanning system 31b, into which light 34b of the laser 2b is directed. The scanning system 31b comprises two scanning mirrors 67b, 68b, each of which being configured to be pivotable about a scanning axis. The scanning axes of the scanning mirrors 67b, 68b are oriented orthogonally relative to each other.

After leaving the scanning system 31b, the light 70b impinges onto a semi-transparent mirror 61b. The semi-transparent mirror 61b functions as a beam splitter, splitting the light 70b into the first laser beam 35b and the second laser beam 36b. The second laser beam 36b is deflected by the semi-transparent mirror 61b, such that it impinges onto the objective lens 33b. The first laser beam 35b leaves the semi-transparent mirror 61b undeflected and is deflected onto the objective lens 33b by a deflecting mirror 62b. Thereby, the first laser beam 35b and the second laser beam 36b are directed onto the objective lens 33b from two different deflection points.

Each of the semi-transparent mirror 61b and the deflecting mirror 62b may be configured to be pivotable about one or two pivoting axes. Thereby, an inclination of a beam guidance plane, which is spanned by the incidence directions along the axes 37b, 38b of the first and second laser beams 35b, 36b may be variable.

Figure 5A:
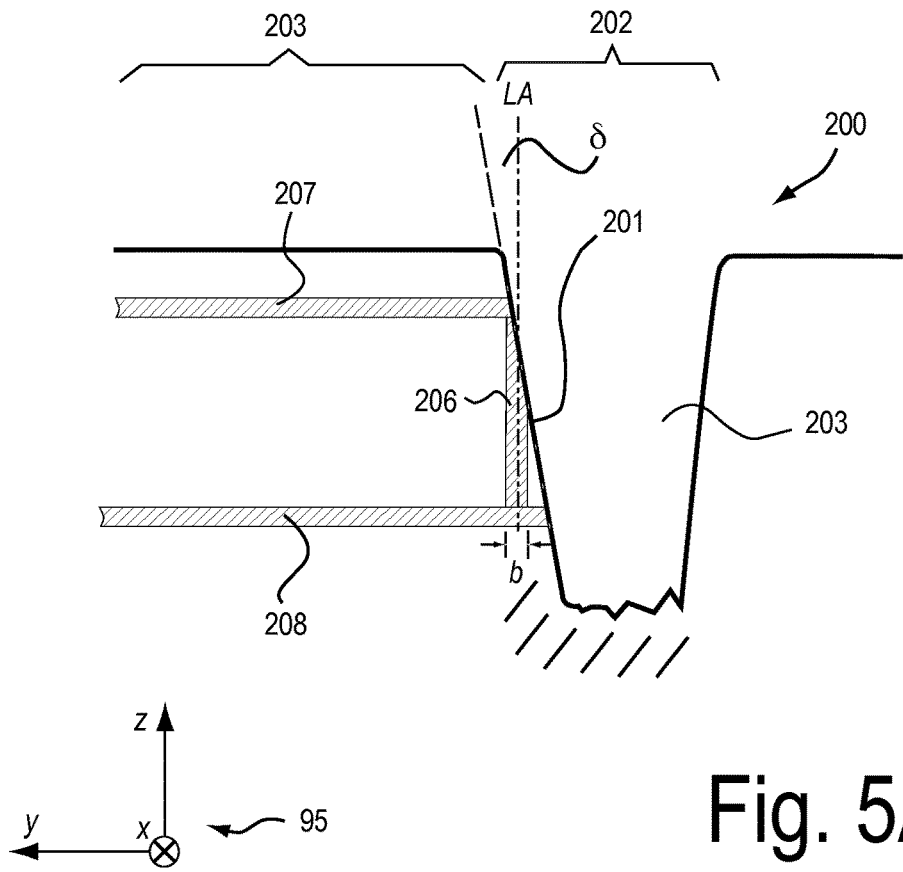
FIG. 5A schematically illustrates a pre-prepared surface region, being prepared according to a second exemplary method.
Figure 5B:
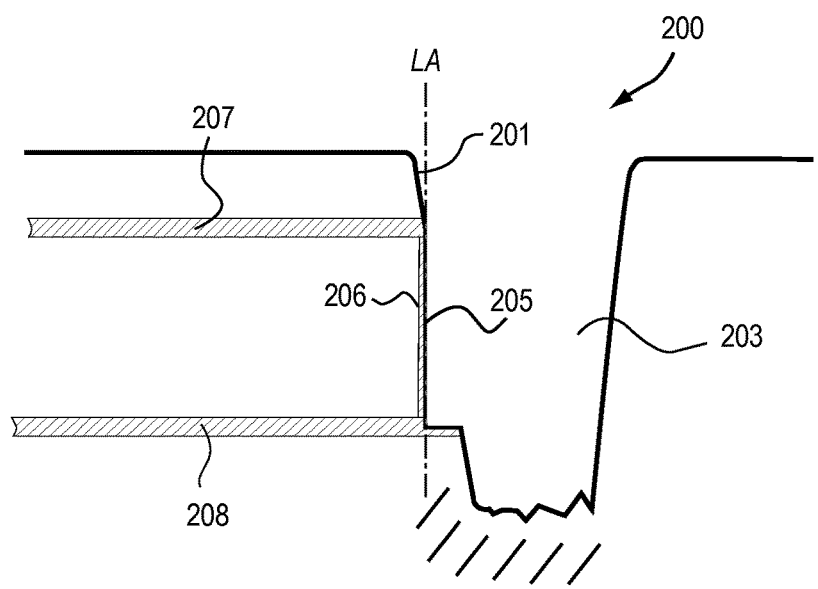
FIG. 5B schematically illustrates the cross-section, being formed from the pre-prepared surface region, shown in FIG. 5A according to the second exemplary method.

FIGS. 5A and 5B illustrate a second exemplary method for forming cross sections by using any of the exemplary processing systems, as has been described with reference to FIGS. 1, 4A and 4B. FIGS. 5A and 5B show a cross-sectional view of the surface 200 of an object. A groove 203 has been formed by laser ablation in the processing region 202 with a pre-prepared surface region on a sidewall of the groove 203.

From the pre-prepared surface region 201, a cross-section 205, extending through a through silicon via (TSV) 206 is to be formed by the focussed ion beam. The cross-section 205 is to be oriented along a longitudinal axis LA of the through silicon via 206. The through silicon via 206 connects an upper conducting layer 207 with a lower conducting layer 208.

It has shown to be advantageous if an inclination of the pre-prepared surface region 201 is less than the target value of the cross-section 205 by a value of between 3 and 10 degrees or by a value of between 3 and 8 degrees or by a value of between 3 and 5 degrees. This reduces the time necessary to perform the focussed ion beam preparation.

This requirement for the inclination of the pre-prepared surface region 201 results in an angle δ between the pre-prepared surface region 201 and the cross-section 205 being greater than 3 degrees. Thereby, the focussed ion beam and the pre-prepared surface region 201, form a sufficiently large angle such that the cross-section 205 can be exposed by the focused ion beam through a well-controlled process. This also makes it much easier to re-locate the portion of the processing region 202, from which the cross-section is to be formed. Re-locating this portion may be performed depending on microscopic images, which have been acquired by the focussed ion beam system or the scanning electron microscope system.

Moreover, through the upper limit for the value of the angle δ, the volume portion, which has to be removed by the focused ion beam is kept small. Thereby, it is possible, to generate the cross-section 205 from the pre-prepared surface region 201 within a short time.

The processing system is configured such that a target inclination of the cross-section 205 is determinable. The target inclination may be determined depending on structures of the object, which are to be inspected, such as the through silicon via 206. Depending on the target inclination of the cross-section 205, it is possible to determine a target inclination of the pre-prepared surface region 201. Thereby, a short preparation time for focused ion beam preparation can be achieved.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

The invention claimed is:

1. A processing system for forming a cross-section of an object, the processing system comprising:
 a focused ion beam system for forming the cross-section from a prepared surface region of the object;
 a laser and a light optical system for forming the prepared surface region by laser ablation of a processing region of the object wherein the forming of the prepared surface region comprises scanning each of a first and a second laser beam along a common scanning line in the processing region;
 wherein the light optical system is configured to direct the first laser beam onto common impingement locations of the common scanning line for performing the scanning of the first laser beam along the common scanning line and to direct the second laser beam onto the common impingement locations for performing the scanning of the second laser beam along the common scanning line;
 wherein for each of the impingement locations, an angle between a first incidence direction along an axis of the first laser beam and a second incidence direction along an axis of the second laser beam is greater than 10 degrees, measured in a stationary coordinate system;
 wherein the processing system further comprises a positioning system for positioning the object, such that a translational movement translates the processing region from a first arrangement of the processing region for the scanning of the first laser beam to a second arrangement of the processing region for the scanning of the second laser beam.

2. The processing system of claim 1, wherein the light optical system is configured such that a lateral deviation between a scanning path of the first laser beam and a scanning path of the second laser beam, generated by the scanning of the first and the second laser beams, is smaller than 1 micrometer, or smaller than 0.5 micrometers, or smaller than 0.2 micrometers, or smaller than 0.1 micrometers, or smaller than 50 nanometers.

3. The processing system of claim 1, wherein the light optical system is configured such that the axis of the first laser beam and the axis of the second laser beam are aligned along a common beam guidance plane, during the scanning of the first and the second laser beams.

4. The processing system of claim 3, wherein the processing system is configured such that an inclination of the beam guidance plane is adjustable over an angular range of at least 10 degrees, measured in a stationary coordinate system.

5. The processing system according to claim 1, wherein the light optical system is configured such that the angle between the first incidence direction and the second incidence direction is greater than 15 degrees, or greater than 20 degrees, or greater than 30 degrees, or greater than 40 degrees, or greater than 50 degrees, or greater than 70 degrees.

6. The processing system according to claim 1, further comprising a pivotable deflecting element;
 wherein the light optical system is configured to switch from the first incidence direction to the second incidence direction;
 wherein the switching from the first incidence direction to the second incidence direction comprises pivoting the pivotable deflecting element.

7. The processing system of claim 1, wherein in each of the first and the second arrangements, the common scanning line is oriented substantially along a plane which is spanned by the axis of the first laser beam and the axis of the second laser beam;
 wherein the plane is determined by measuring the axis of the first laser beam during the scanning of the first laser beam and measuring the axis of the second laser beam during the scanning of the second laser beam.

8. The processing system of claim 1, wherein the prepared surface region is a sidewall formed along the common scanning line.

9. The processing system of claim 1, further comprising a position sensor configured to determine a position of the object and/or a position of the object holder when the processing region is in the first arrangement and/or when the processing region is in the second arrangement.

10. The processing system of claim 6, wherein at least one of the following holds true:
the pivotable deflecting element is configured to scan the first and the second laser beam in one or two dimensions to perform the scanning of the first laser beam and the scanning of the second laser beam; or
the light optical system comprises a scanning system upstream of the pivotable deflecting element.

11. A processing system for forming a cross-section of an object, the processing system comprising:
a focused ion beam system for forming the cross-section from a prepared surface region of the object;
a laser and a light optical system for forming the prepared surface region by laser ablation of a processing region of the object wherein the forming of the prepared surface region comprises scanning each of a first and a second laser beam along a common scanning line in the processing region;
wherein the first laser beam is directable onto common impingement locations of the common scanning line for performing the scanning of the first laser beam along the common scanning line and the second laser beam is directable onto the common impingement locations for performing the scanning of the second laser beam along the common scanning line;
wherein an arrangement of the processing region during the scanning of the first laser beam is substantially identical to an arrangement of the processing region during the scanning of the second laser beam;
wherein for each of the impingement locations, an angle between a first incidence direction along an axis of the first laser beam and a second incidence direction along an axis of the second laser beam is greater than 10 degrees, measured in a stationary coordinate system.

12. The processing system according to claim 11, wherein the light optical system comprises:
a first and a second deflecting element, each of which deflecting either the first or the second laser beam, such that a deflection point of the first laser beam is different from a deflection point of the second laser beam.

13. The processing system according to claim 12, wherein the first deflecting element is configured as a beam splitter.

14. The processing system according to claim 11, wherein the light optical system is configured such that the angle between the first incidence direction and the second incidence direction is greater than 15 degrees, or greater than 20 degrees, or greater than 30 degrees, or greater than 40 degrees, or greater than 50 degrees, or greater than 70 degrees.

15. The processing system according to claim 11, wherein the light optical system is configured such that the axis of the first laser beam and the axis of the second laser beam are aligned along a common beam guidance plane, during the scanning of the first and the second laser beams.

16. The processing system of claim 11, wherein the scanning line is oriented along a plane which is spanned by the axis of the first laser beam and the axis of the second laser beam;
wherein the plane is determined by measuring the axis of the first laser beam during the scanning of the first laser beam and measuring the axis of the second laser beam during the scanning of the second laser beam.

17. The processing system of claim 11, wherein the prepared surface region is a sidewall formed along the common scanning line.

18. The processing system of claim 15, wherein the processing system is configured such that an inclination of the beam guidance plane is adjustable over an angular range of at least 10 degrees, measured in a stationary coordinate system.

19. A processing system for forming a cross-section of an object, the processing system comprising:
a focused ion beam system for forming the cross-section from a prepared surface region of the object;
a laser and a light optical system for forming the prepared surface region by laser ablation of a processing region of the object wherein the forming of the prepared surface region comprises canning each of a first laser beam and a second laser beam along a common scanning line in the processing region;
wherein the light optical system is configured to direct the first laser beam onto common impingement locations of the common scanning line for performing the scanning of the first laser beam along the common scanning line and to direct the second laser beam onto the common impingement locations for performing the scanning of the second laser beam along the common scanning line;
wherein for each of the impingement locations, an angle between a first incidence direction along an axis of the first laser beam and a second incidence direction along an axis of the second laser beam is greater than 10 degrees, measured in a stationary coordinate system.

20. The processing system according to claim 19, wherein the light optical system is configured such that the axis of the first laser beam and the axis of the second laser beam are aligned along a common beam guidance plane, during the scanning of the first and the second laser beams.

21. The processing system according to claim 19, wherein the light optical system is configured such that the angle between the first incidence direction and the second incidence direction is greater than 15 degrees, or greater than 20 degrees, or greater than 30 degrees, or greater than 40 degrees, or greater than 50 degrees, or greater than 70 degrees.

22. The processing system of claim 19, wherein the scanning line is oriented along a plane which is spanned by the axis of the first laser beam and the axis of the second laser beam;
wherein the plane is determined by measuring the axis of the first laser beam during the scanning of the first laser beam and measuring the axis of the second laser beam during the scanning of the second laser beam.

23. The processing system of claim 19, wherein the prepared surface is a sidewall formed along the common scanning line.

24. The processing system of claim 19, wherein the light optical system is configured such that a lateral deviation between a scanning path of the first laser beam and a scanning path of the second laser beam, generated by the scanning of the first and the second laser beams, is smaller than 1 micrometer, or smaller than 0.5 micrometers, or smaller than 0.2 micrometers, or smaller than 0.1 micrometers, or smaller than 50 nanometers.

25. The processing system of claim 20, wherein the processing system is configured such that an inclination of the beam guidance plane is adjustable over an angular range of at least 10 degrees, measured in a stationary coordinate system.

26. A method of operating a processing system for forming a cross-section from a prepared surface region of an object, wherein the processing system comprises:
   a focused ion beam system for forming the cross-section from the prepared surface region;
   a laser and a light optical system for forming the preprepared surface region by laser ablation of a processing region of the object;
   wherein the forming of the prepared surface region comprises scanning each of a first and a second laser beam along a scanning line in the processing region;
   wherein the method comprises:
   performing the scanning of the first laser beam by directing the first laser beam onto impingement locations of the scanning line in the processing region of the object, wherein the processing region is arranged in a first arrangement;
   performing a translational movement by a positioning system such that the translational movement translates the first arrangement of the processing region into a second arrangement of the processing region; and
   performing the scanning of the second laser beam by directing the second laser beam onto the impingement locations of the scanning line;
   wherein for each of the impingement locations, an angle between a first incidence direction along an axis of the first laser beam and a second incidence direction along an axis of the second laser beam is greater than 10 degrees, measured in a stationary coordinate system.

27. A method of operating a processing system for forming a cross-section from a prepared surface region of an object, wherein the processing system comprises:
   a focused ion beam system for forming the cross-section from the prepared surface region;
   a laser and a light optical system for forming the prepared surface region by laser ablation in a processing region of the object;
   wherein the forming of the prepared surface region comprises scanning each of a first and a second laser beam along a scanning line;
   wherein the method comprises:
   performing the scanning of the first laser beam by directing the first laser beam onto impingement locations of a scanning line in the processing region of the object; and
   performing the scanning of the second laser beam by directing the second laser beam onto the impingement locations of the scanning line;
   wherein an arrangement of the processing region during the scanning of the first laser beam is substantially identical to an arrangement of the processing region during the scanning of the second laser beam;
   wherein for each of the impingement locations, an angle between a first incidence direction along an axis of the first laser beam and a second incidence direction along an axis of the second laser beam is greater than 10 degrees, measured in a stationary coordinate system.

28. A method of operating a processing system for forming a cross-section from a prepared surface region of an object; wherein the processing system comprises:
   a focused ion beam system for forming the cross-section from a prepared surface region of the object;
   a laser and a light optical system for forming the prepared surface region by laser ablation of a processing region of the object;
   wherein the forming of the prepared surface region comprises scanning each of a first laser beam and a second laser beam along a scanning line in the processing region;
   wherein the method comprises:
   performing the scanning of the first laser beam by directing the first laser beam onto impingement locations of a scanning line; and
   performing the scanning of the second laser beam by directing the second laser beam onto the impingement locations of the scanning line;
   wherein for each of the impingement locations, an angle between a first incidence direction along an axis of the first laser beam and a second incidence direction along an axis of the second laser beam is greater than 10 degrees, measured in a stationary coordinate system.

\* \* \* \* \*

UNITED STATES PATENT AND TRADEMARK OFFICE
CERTIFICATE OF CORRECTION

PATENT NO. : 9,793,122 B2
APPLICATION NO. : 13/905085
DATED : October 17, 2017
INVENTOR(S) : Kuebler It is certified that error appears in the above-identified patent and that said Letters Patent is hereby corrected as shown below:

In the Specification

Column 9
Line 12, "between and an" should read --between an--
Line 43, "focussed" should read --focused--

Column 14
Line 13, "focussed" should read --focused--
Line 32, "system 9" should read --system 4--

Column 15
Line 4, "an" should read --and--
Line 6, "from to the" should read --from the--
Line 23, "direction" should read --direction 44--
Line 35, "5A and 5A" should read --5A and 5B--
Line 39, "embodiments" should read --embodiment--

Column 16
Line 18, "lens 36a. When impinging on the objective lens 36a" should read --"lens 33a. When impinging on the objective lens 33a--

Column 17
Line 6, "cross section" should read --cross-section--
Line 15, "focussed" should read --focused--
Line 25, "focussed" should read --focused--
Line 29, "focussed" should read --focused--
Line 37, "focussed" should read --focused--

Signed and Sealed this
Thirtieth Day of January, 2018

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,793,122 B2

In the Claims

Column 20
Line 24, "canning" should read --scanning--